(12) United States Patent
Ghozeil et al.

(10) Patent No.: US 7,902,015 B2
(45) Date of Patent: *Mar. 8, 2011

(54) ARRAY OF NANOSCOPIC MOSFET TRANSISTORS AND FABRICATION METHODS

(75) Inventors: Adam L Ghozeil, Corvallis, OR (US); James Stasiak, Lebanon, OR (US); Kevin Peters, Corvallis, OR (US); Galen H. Kawamoto, Corvallis, OR (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1312 days.

This patent is subject to a terminal disclaimer.

(21) Appl. No.: 11/126,710

(22) Filed: May 10, 2005

(65) Prior Publication Data

US 2005/0219936 A1 Oct. 6, 2005

Related U.S. Application Data

(62) Division of application No. 10/620,858, filed on Jul. 15, 2003, now Pat. No. 7,005,335.

(51) Int. Cl.
*H01L 21/8238* (2006.01)
(52) U.S. Cl. ... 438/199; 438/301; 438/670; 257/E29.126
(58) Field of Classification Search .......... 438/197, 438/199, 301, 670, 671, 592, 593, 128, 129, 438/130, 275, 278, 290, 285, 590, 587–589, 438/758; 257/E29.126, E21.685, E21.694, 257/E21.68, E21.422, E21.209, E21.433, 257/E21.621, E29.051; 365/232
See application file for complete search history.

(56) References Cited

U.S. PATENT DOCUMENTS

| | | | |
|---|---|---|---|
| 4,833,514 A | 5/1989 | Esquivel et al. |
| 5,238,855 A | 8/1993 | Gill |
| 5,646,888 A | 7/1997 | Mori |
| 5,772,905 A | 6/1998 | Chou |

(Continued)

FOREIGN PATENT DOCUMENTS

EP 0902465 A1 3/1999

OTHER PUBLICATIONS

International Search Report for PCT Application No. PCT/IS2004/020675, filed Jun. 25, 2004, Hewlett-Packard Company, Search Report completed on Feb. 18, 2005.

(Continued)

*Primary Examiner* — Davienne Monbleau
*Assistant Examiner* — Dilinh P Nguyen
(74) *Attorney, Agent, or Firm* — Myers Bigel Sibley & Sajovec, P.A.

(57) ABSTRACT

A nanoscopic transistor is made by forming an oxide layer on a semiconductor substrate, applying resist, patterning the resist using imprint lithography to form a pattern aligned along a first direction, applying a first ion-masking material over the pattern, selectively lifting it off to leave a first ion mask to form a gate, forming doped regions by implanting a suitable dopant, applying another layer of resist and patterning the second resist layer using imprint lithography to form a second pattern aligned along a second direction, applying a second ion-masking material over the second pattern, selectively lifting it off to leave a second ion mask defined by the second pattern, and forming second doped regions in the substrate by implanting a suitable second dopant selectively in accordance with the second ion mask. The method may be used to make an array of nanoscopic transistors.

4 Claims, 11 Drawing Sheets

U.S. PATENT DOCUMENTS

| | | | |
|---|---|---|---|
| 6,069,380 A * | 5/2000 | Chou et al. | 257/315 |
| 6,128,214 A | 10/2000 | Keukes et al. | |
| 6,256,767 B1 | 7/2001 | Keukes et al. | |
| 6,294,450 B1 | 9/2001 | Chen et al. | |
| 6,314,019 B1 | 11/2001 | Keukes et al. | |
| 6,407,443 B2 | 6/2002 | Chen et al. | |
| 6,432,740 B1 | 8/2002 | Chen | |
| 6,458,621 B1 | 10/2002 | Beck | |
| 6,459,095 B1 | 10/2002 | Heath et al. | |
| 6,517,995 B1 | 2/2003 | Jacobson et al. | |
| 6,518,156 B1 | 2/2003 | Chen et al. | |
| 6,518,189 B1 | 2/2003 | Chau | |
| 7,005,335 B2 * | 2/2006 | Ghozeil et al. | 438/199 |
| 2002/0130353 A1 | 9/2002 | Lieber et al. | |
| 2003/0003775 A1 | 1/2003 | Chen | |
| 2003/0042558 A1 | 3/2003 | Noguchi et al. | |
| 2003/0161192 A1 * | 8/2003 | Kobayashi et al. | 365/200 |

OTHER PUBLICATIONS

Y. Chen et al., Nanoscale Molecular-Switch Devices Fabricated By Imprint Lithography, Appl. Phys. Letters V. 82(10) (Mar. 10, 2003), pp. 1610-1612.

D.Y. Khang et al., Wafer-Scale Sub-Micron Lithography, Appl. Phys. Letters V. 75 (17)), (Oct. 25, 1999), pp. 2599-2601.

X. Sun et al., Multilayer Resist Methods For Nanoimprint Lithography On Nonflat Surfaces, J. Vac. Sci. Technol. B. 16(6), Nov./Dec. 1998, pp. 3922-3925.

L. Guo et al., Nanoscale Silicon Field Effect Transistors Fabricated Using Imprint Lithography, Appl. Phys. Letters, vol. 71, (Sep. 29, 1997), pp. 1881-1883.

L. Guo et al., A Silicon Single-Electron Transistor Memory Operating At Room Temperature, Science V. 275(31), Jan. 1997, pp. 649-651.

P.R. Krauss et al., Fabrication Of Nanodevices Using Sub-25 nm Imprint Lithography, 1996 54th Annual Device Research Conf., IEEE, Jun. 24-26, 1996, pp. 194-195.

S.Y. Chou et al., Nanoimprint Lithography, J. Vac. Sci. Technol. B 14(6), Nov./Dec. 1996, pp. 4129-4133.

S.Y. Chou et al., Imprint Lithography With 25-Nanometer Resolution, Science V. 272 (Apr. 5, 1996), pp. 85-87.

S.Y. Chou et al., Imprint of Sub-25 nm Vias And Trenches In Polymers, Appl. Phys. Letters V. 76 (1995), pp. 3114-3116.

* cited by examiner

ARRAY OF NANOSCOPIC MOSFET TRANSISTORS AND FABRICATION METHODS

CROSS REFERENCE TO RELATED APPLICATIONS

This is a division of U.S. patent application Ser. No. 10/620,858 filed Jul. 15, 2003 now U.S. Pat. No. 7,005,335 titled Array of Nanoscopic MOSFET Transistors and Fabrication Methods.

TECHNICAL FIELD

This invention relates to arrays of nanoscopic transistors and more particularly to fabrication methods therefor, using imprinting.

BACKGROUND

In the field of electronic devices, the trend toward decreasing feature sizes for miniaturization and increased device density continues unabated. According to the report by the U.S. National Science and Technology Council Committee on Technology, "Nanotechnology Research Directions: IWGN Workshop Report—Vision for Nanotechnology R&D in the Next Decade" (September 1999), systems built using devices in the dimensional domain of nanometers (called "nanoscale systems") have the potential of increasing computer efficiency by millions of times. In this specification and the appended claims, the term "nanoscopic" will be used to characterize features in the dimensional range of less than about 1,000 nanometers. Those skilled in the art will recognize that many benefits of nanoscale devices are best realized when the minimum feature size dimensions are less than about 100 nanometers.

To achieve the benefits of nanoscale systems it would be especially useful to be able to make arrays of nanoscopic transistors. However, the problems involved in precise alignment of the elements of such nanoscopic devices have been difficult to solve. Individual nanoscopic field-effect transistors (FET's) have been made with photolithographically defined gates having fairly large dimensions. In other approaches, fabrication methods have been employed using free-floating nanowires and using flowing fluids to steer and coarsely align the nanowires to each other.

"Nanoimprint" lithography has been described by Stephen Y. Chou et al. in articles: "Imprint of Sub-25-nm Vias and Trenches in Polymers," *Applied Physics Letters*, V. 67 (1995) pp. 3114-3116; "Imprint Lithography with 25 nm Resolution," *Science*, V. 272 (Apr. 5, 1996) pp. 85-87; and "Nanoimprint Lithography," *J. Vac. Sci. Technol.*, B 14(6) (November/December 1996) pp. 4129-4133. Various nanodevices have been made by using nanoimprint lithography methods, producing devices having a relatively large common third terminal (frequently the substrate) which is not nanoscopic. None of these prior solutions provides arrays of three-terminal fully-nanoscopic devices, based on only two nano-imprinted layers.

BRIEF DESCRIPTION OF THE DRAWINGS

The features and advantages of the disclosure will readily be appreciated by persons skilled in the art from the following detailed description when read in conjunction with the drawings, wherein:

FIG. 14b is a schematic diagram of the FET transistor array embodiment shown in FIG. 14a.

FIG. 15b is a schematic diagram of the FET transistor array embodiment shown in FIG. 15a.

DETAILED DESCRIPTION OF EMBODIMENTS

For clarity of the description, the embodiments will be described first in terms of fabrication method embodiments and then in terms of the structural embodiments produced by those methods. In the flow-chart drawings (FIGS. 1 and 16), various steps in the method embodiments illustrated are identified by reference numerals S10, . . . , S130. (Please note that in FIGS. 14a-15b references S1-S5, with "S" followed by a single numerical digit, refer to source regions, not method steps). The numerical sequence of reference numerals and the arrows connecting various steps are shown for easy reference to the figures and are not intended to limit the disclosed methods to particular orders of performing the steps. Those skilled in the art will recognize that the order of steps may be varied. The drawings that show structural embodiments in various stages of fabrication (FIGS. 2-13 and 17-34) are not drawn to any uniform scale. In particular, vertical and horizontal scales may differ within each drawing figure and may differ from figure to figure.

Fabrication

In accordance with one aspect of the invention, a method for fabricating a nanoscopic transistor is provided, comprising the steps of:

a) providing a semiconductor substrate;
b) forming a thin oxide layer on the semiconductor substrate;
c) applying a first layer of resist;
d) patterning the first layer of resist using imprint lithography to form a first pattern aligned along a first direction;
e) applying a first ion-masking material over the first pattern, and selectively lifting off the first ion-masking material to leave a first ion mask defined by the first pattern, the first ion mask optionally being suitable to form a gate;
f) forming first doped regions in the semiconductor substrate by implanting a suitable first dopant selectively in accordance with the first ion mask;
g) applying a second layer of resist and patterning the second layer of resist using imprint lithography to form a second pattern aligned along a second direction;
h) applying a second ion-masking material over the second pattern, and selectively lifting off the second ion-masking material to leave a second ion mask defined by the second pattern; and
i) forming second doped regions in the semiconductor substrate by implanting a suitable second dopant selectively in accordance with the second ion mask.

Figure 1:
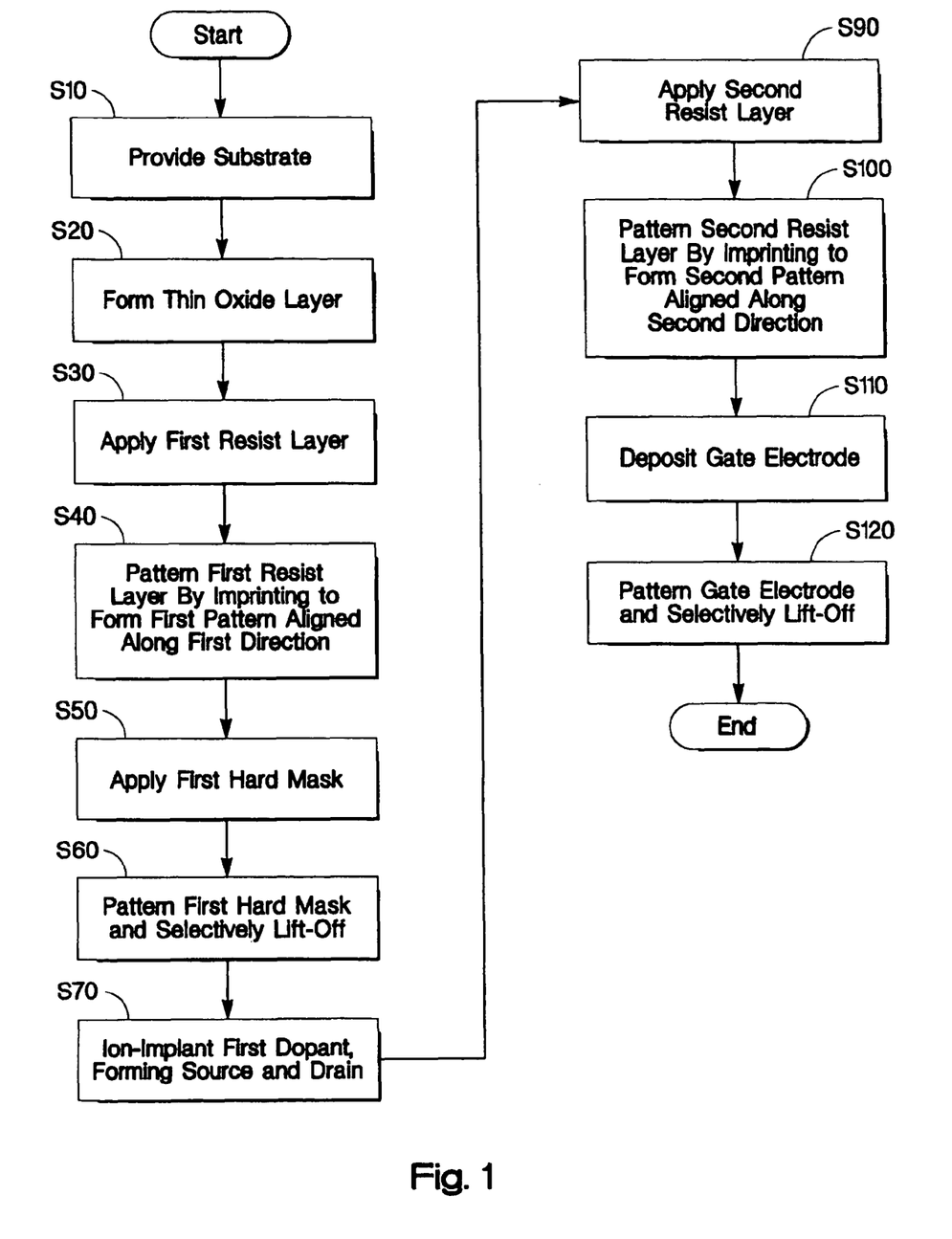
FIG. 1 is a flow chart illustrating a first embodiment of a fabrication method performed in accordance with the invention.

A first embodiment of a fabrication method performed in accordance with the invention is illustrated in the flow chart, FIG. 1. FIGS. 2-13 are schematic perspective views illustrating various stages in fabrication of a device embodiment by the method embodiment of FIG. 1.

Figure 2:
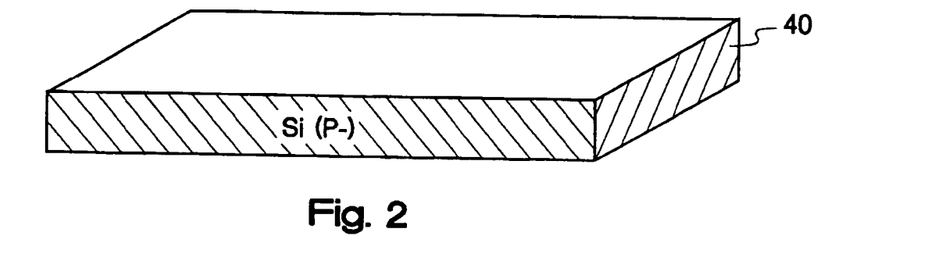
FIGS. 2-13 are schematic perspective views illustrating various stages in fabrication of a device embodiment by the method embodiment of FIG. 1.

To start the process, a suitable substrate 40 is provided (S10). Substrate 40 may be a conventional semiconductor wafer, such as silicon (FIG. 2). In the embodiment shown, the substrate has been doped to have conductivity type P–.

Figure 3:
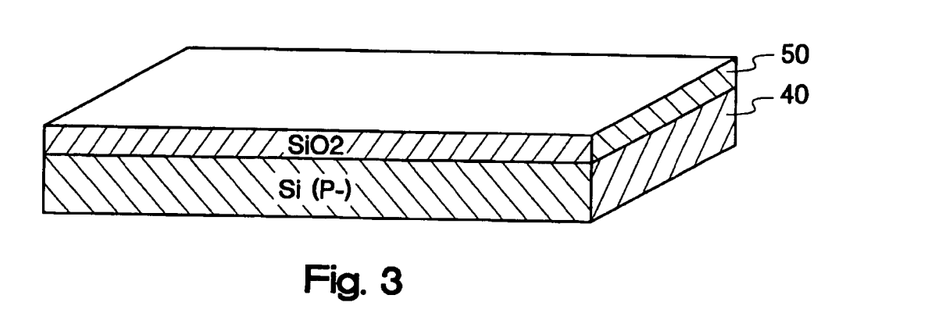
Figure 4:
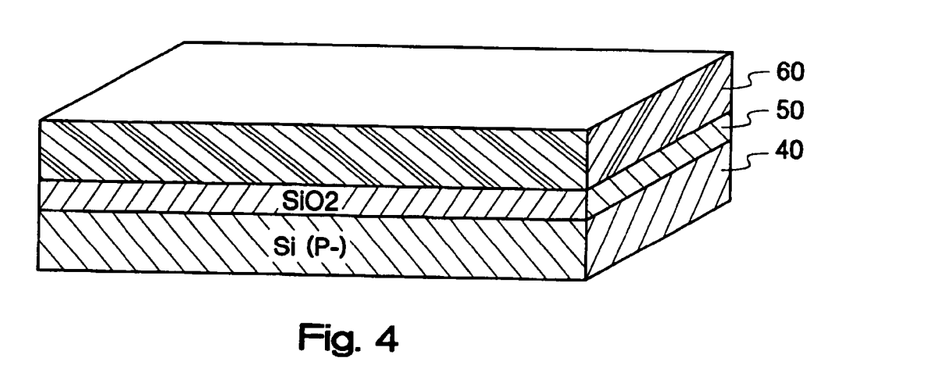
Figure 5:
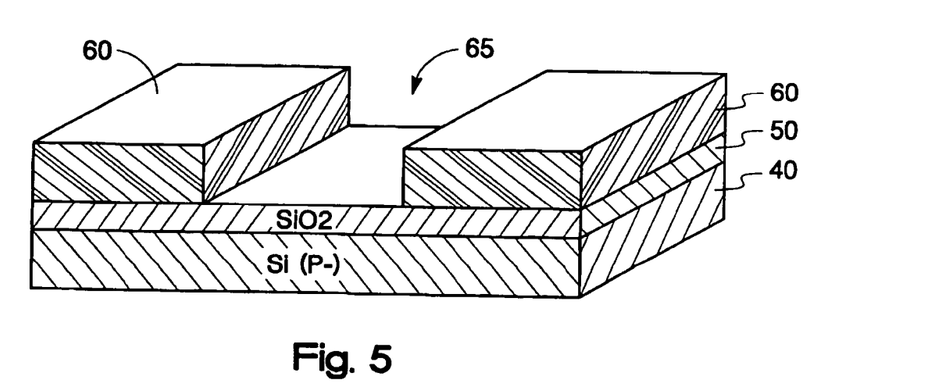

A thin layer of oxide 50 is formed (S20), e.g., by growing silicon dioxide on the surface of substrate 40 (FIG. 3). A first layer of resist 60, e.g., polymethylmethacrylate (PMMA), is applied (S30) over the oxide (FIG. 4).

The first resist layer 60 is patterned by imprinting (S40). A first opening 65 is thus formed in resist layer 60 (FIG. 5), forming a pattern aligned along a first direction. Those skilled in the art will recognize that step S40 of imprint patterning requires the use of a previously-prepared mold, pressed into the resist to imprint the pattern, and typically includes a step of directional etching such as reactive-ion etching (RIE) to completely remove resist material from the valleys (such as opening 65) formed by pressing with the mold. To pattern a mold for nanoimprinting, various conventional high-resolution lithography methods may be used, including those lithography methods with relatively low throughput.

Figure 6:
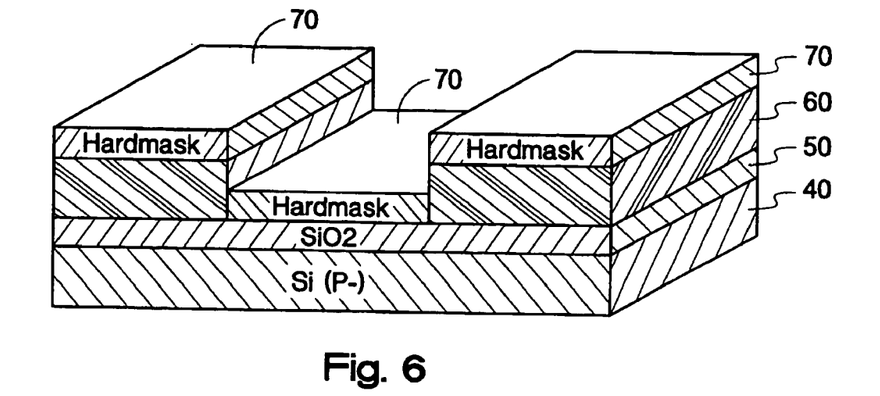
Figure 7:
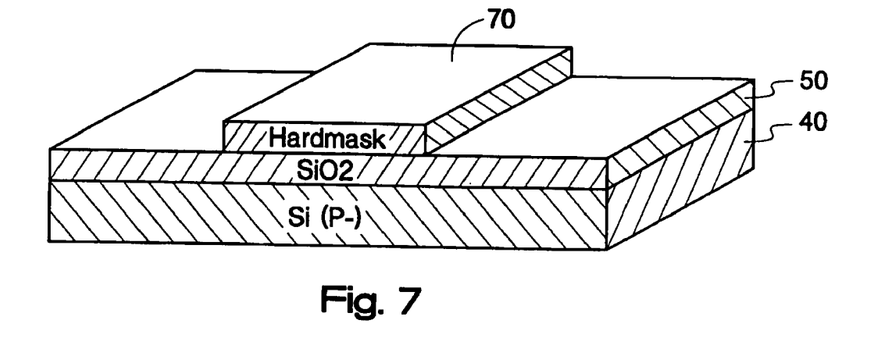
Figure 8:
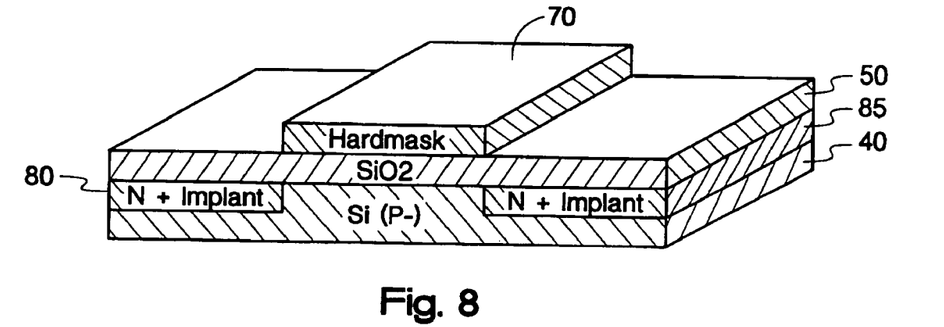
Figure 9:
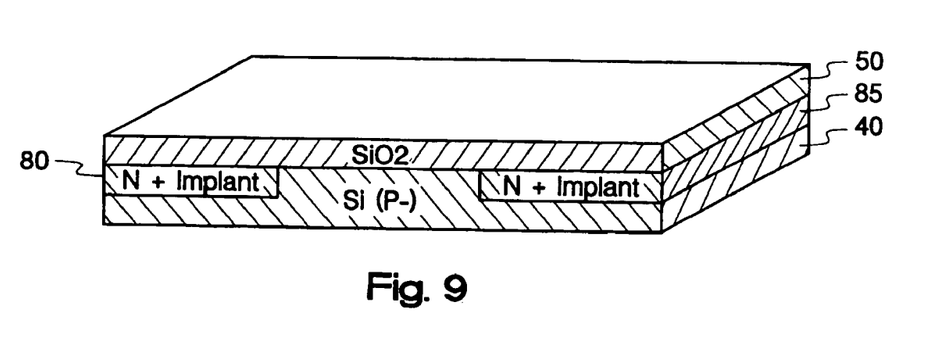

In step S50, a first hard mask material 70 is deposited (FIG. 6). In step S60, the hardmask layer is patterned by selective lift-off. FIG. 7 shows hardmask material 70 remaining in place where opening 65 had been formed, after lifting off the hard mask material over resist. In step S70, a first dopant is ion-implanted in a conventional manner to form source and drain regions 80 and 85 spaced apart from each other (FIG. 8). In the embodiment shown in the drawings, the implanted source and drain regions have conductivity type N+. Optionally, the hard mask material may be removed after the implant (FIG. 9).

Figure 10:
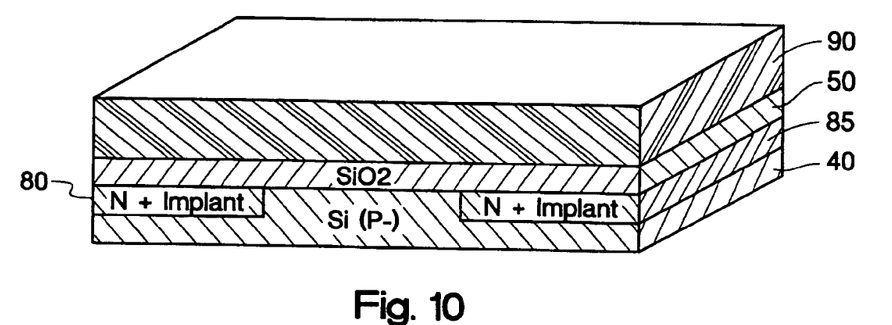
Figure 11:
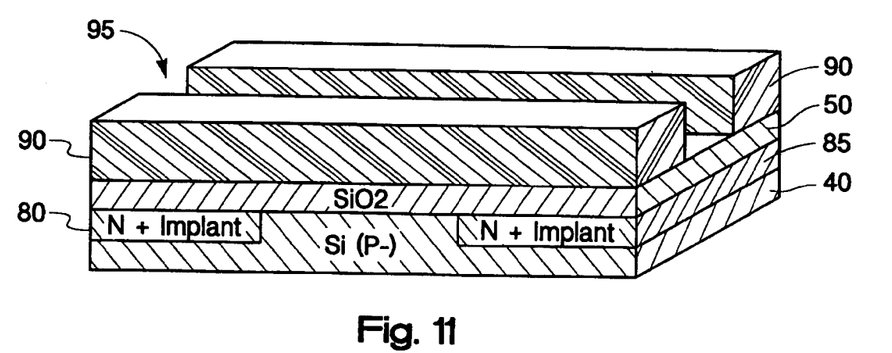
Figure 12:
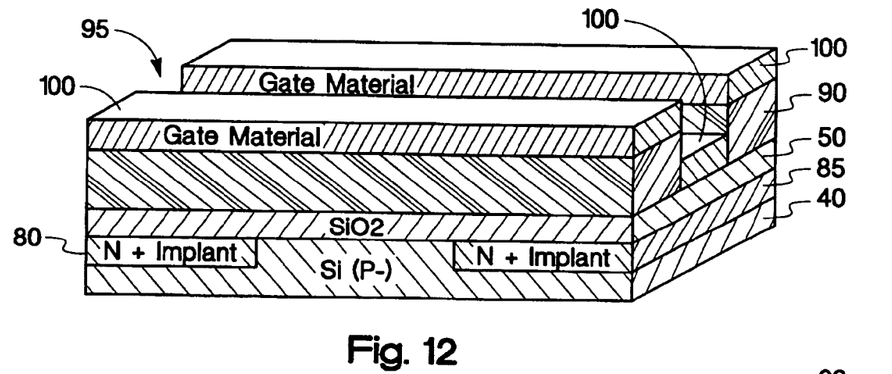

A second resist layer 90, e.g., PMMA, is applied (S90, FIG. 10). Second resist layer 90 is patterned by imprinting (S100). A second opening 95 is thus formed in resist layer 90 (FIG. 11), forming a pattern aligned along a second direction. In the simplest case, step S100 can use the same mold as in step S60, but rotated by 90° so that the second pattern is substantially orthogonal to the first.

Figure 13:
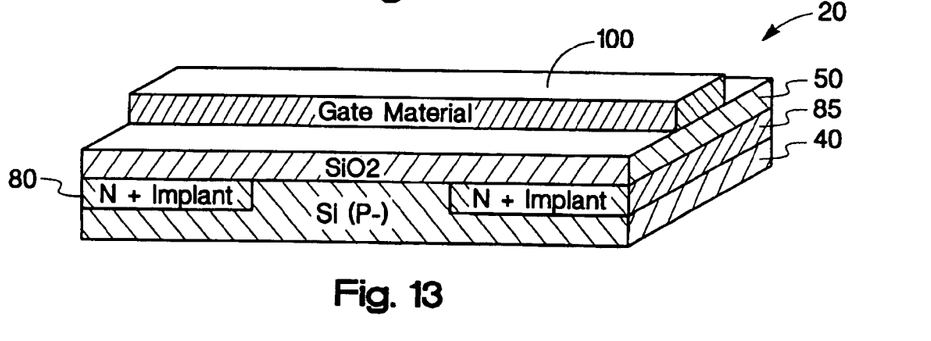

In step S110, gate electrode material 100 is deposited. Gate electrode material 100 is patterned with lift-off to leave the gate extending over both source and drain regions 80 and 85 (FIG. 13). FIG. 13 shows the completed MOSFET device structure 20.

Figure 14A:
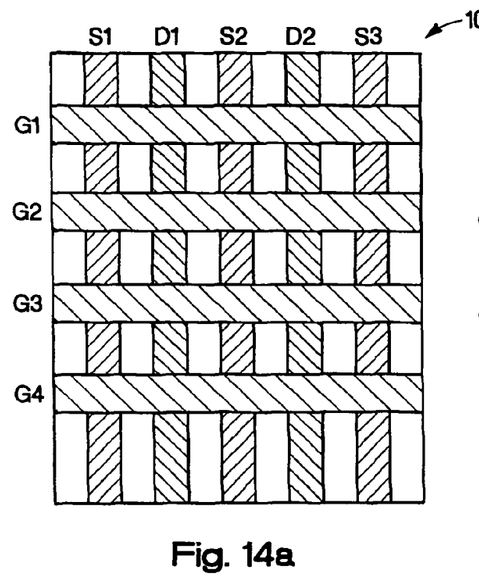
FIG. 14a is a top plan view of a first embodiment of an FET transistor array made in accordance with the invention.
Figure 14B:
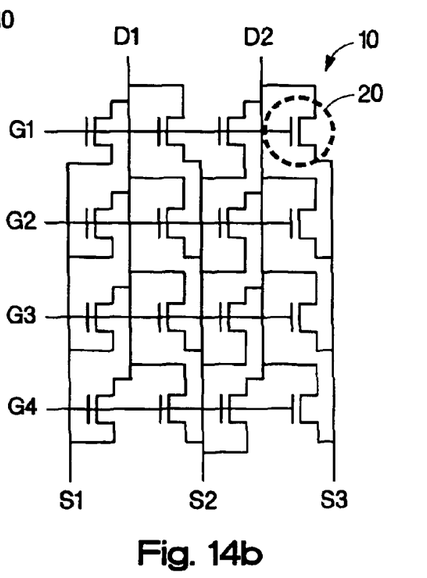

FIG. 14a is a top plan view of a first embodiment of a MOSFET transistor array made in accordance with the invention. The source and drain regions identified by S1, D1, S2, D2, and S3 correspond to the implanted source and drain regions 80 and 85 of FIG. 13. These are aligned along a vertical direction, parallel to the vertical axis of FIG. 14a. The gate metallizations G1, G2, G3, and G4 aligned along a horizontal direction parallel to the horizontal axis of FIG. 14a correspond to gate 100 of FIG. 13. FIG. 14b is a schematic diagram of the MOSFET transistor array embodiment shown in FIG. 14a. MOSFET transistor 20, identified by a dashed circle, corresponds to the device of FIG. 13 and is representative of the sixteen identical MOSFET transistors in the schematic diagram of FIG. 14b.

Figure 15A:
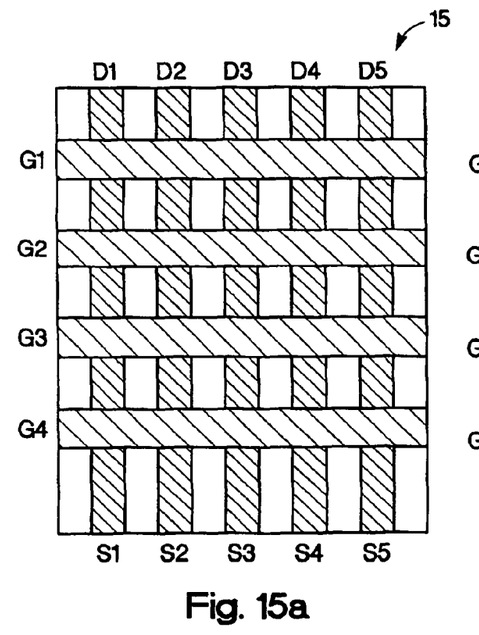
FIG. 15a is a top plan view of a second embodiment of an FET transistor array made in accordance with the invention.
Figure 15B:
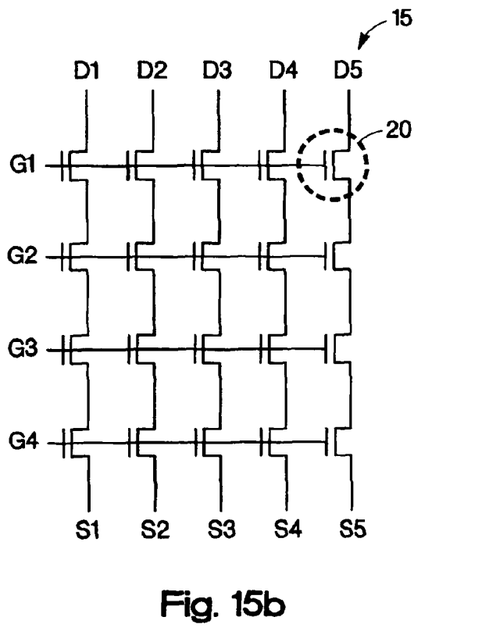

FIG. 15a is a top plan view of a second embodiment of a MOSFET transistor array made in accordance with the invention. The source and drain regions identified by S1, D1, S2, D2, S3, D3, S4, 5, and D5 are formed by replacing the N+ implant described above with a heavier P++ implant and then implanting to make N+ regions (masked by the gate material). FIG. 15b is a schematic diagram of the FET transistor array embodiment shown in FIG. 15a. In FIG. 15b, S1, D1, S2, D2, S3, D3, S4, D4, S5, and D5 correspond to FIG. 15a. MOSFET transistor 20, identified by a dashed circle, is representative of the sixteen identical MOSFET transistors in the schematic diagram of FIG. 15b.

Figure 16:
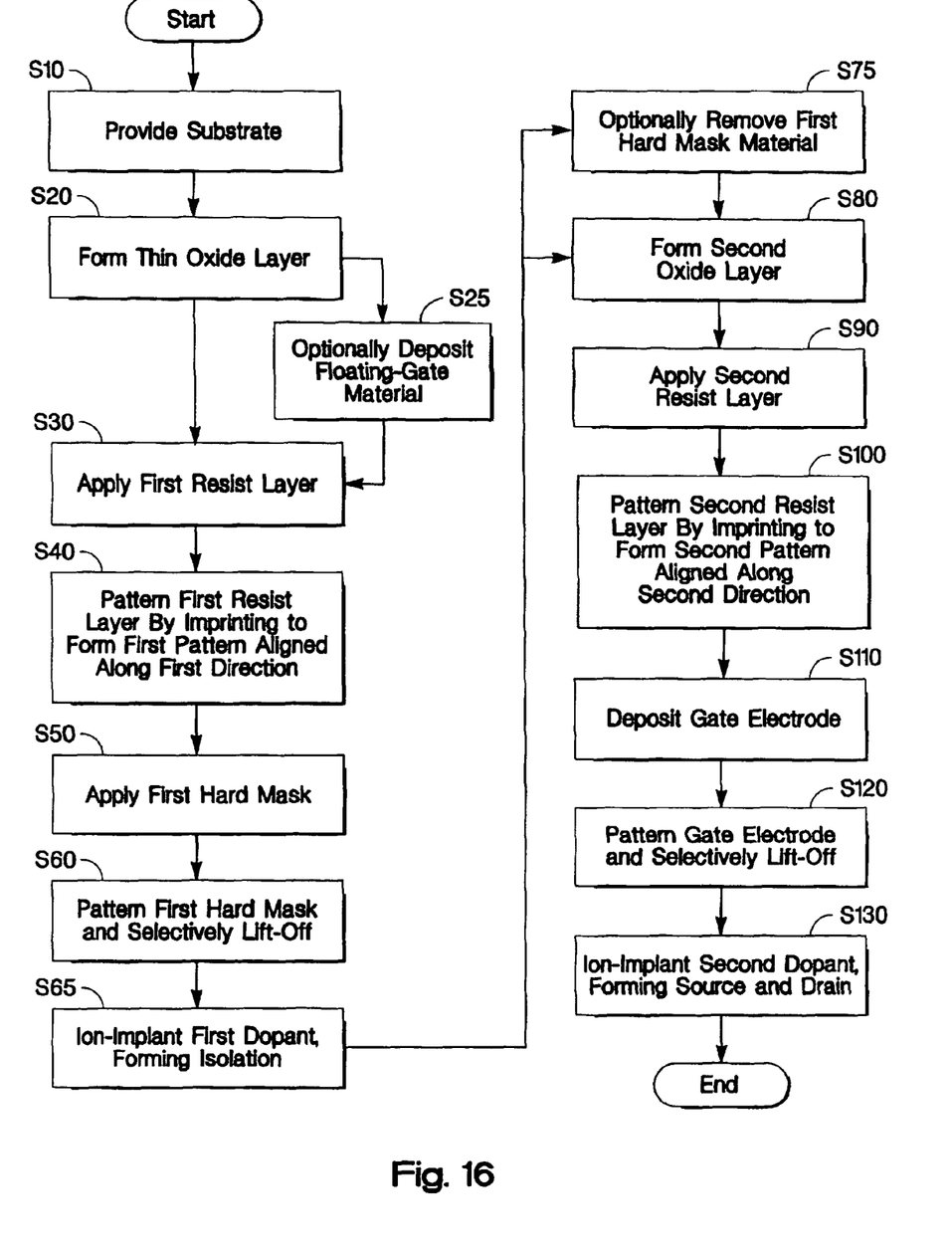
FIG. 16 is a flow chart illustrating a second embodiment of a fabrication method performed in accordance with the invention.
Figure 17:
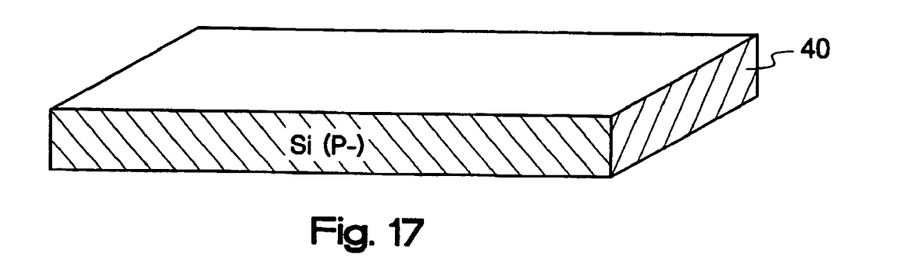
FIGS. 17-34 are schematic perspective views illustrating various stages in fabrication of a device embodiment by the method embodiment of FIG. 16.

A second embodiment of a fabrication method performed in accordance with the invention is illustrated in the flow chart, FIG. 16. FIGS. 17-13 are schematic perspective views illustrating various stages in fabrication of a device embodiment by the method embodiment of FIG. 16. Optionally, an EPROM device may be made by incorporating a floating gate, as described below.

Figure 18:
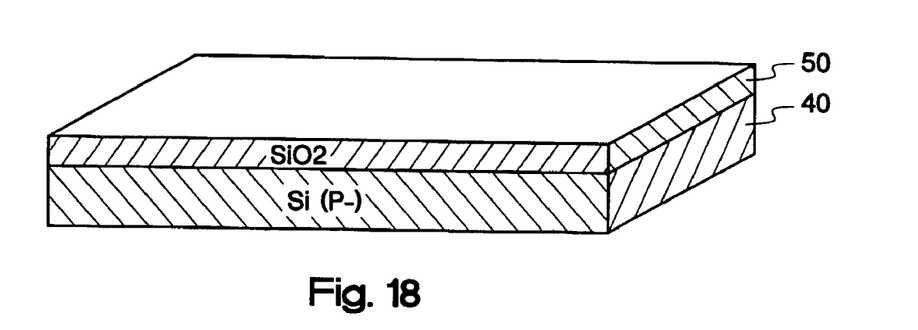

As shown in FIG. 16, the method starts with providing (step S10) a suitable semiconductor substrate 40, such as a silicon wafer of suitable conductivity type (P– in this embodiment) (FIG. 17). A thin layer of oxide 50 is formed (step S20), e.g., by growing $SiO_2$ (FIG. 18).

Figure 19:
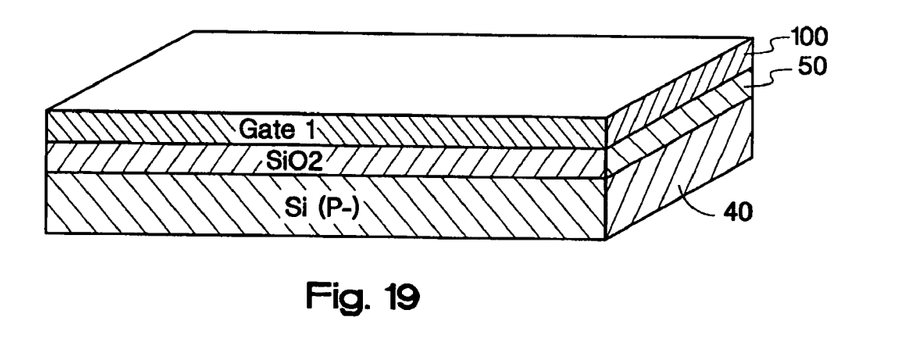
Figure 20:
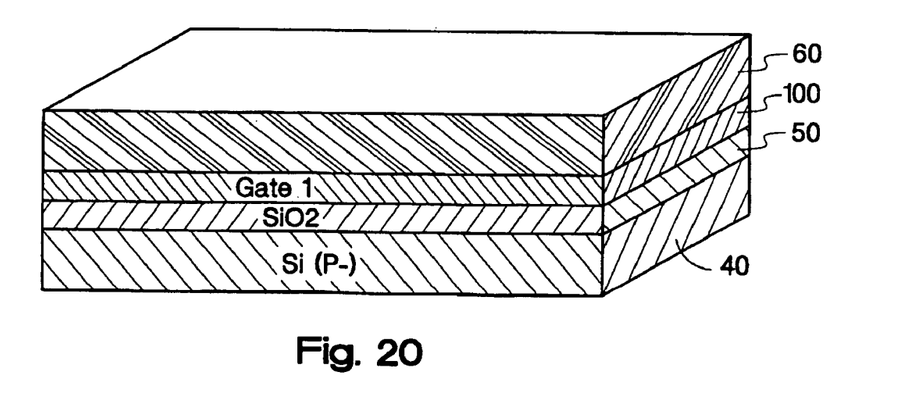
Figure 21:
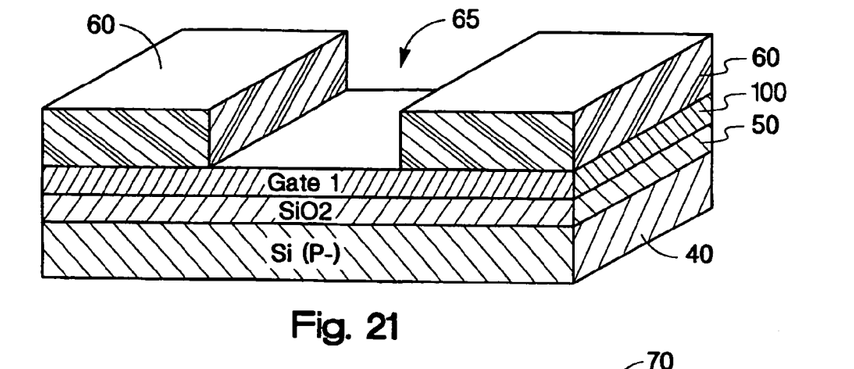

Optionally, a first layer of conductive material 100 for a floating gate may be deposited (step S25, FIG. 19). A first layer of resist 60, e.g., PMMA, is deposited (step S30, FIG. 20). The first resist layer 60 is patterned by imprinting (S40). A first opening 65 is thus formed in resist layer 60 (FIG. 21), forming a pattern aligned along a first direction.

Figure 22:
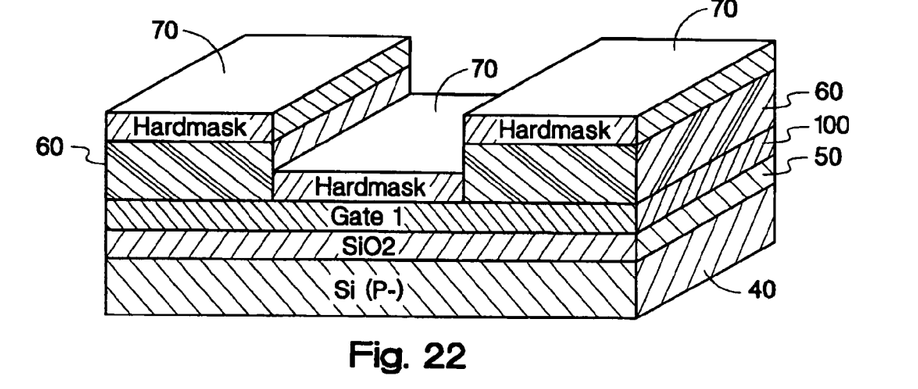
Figure 23:
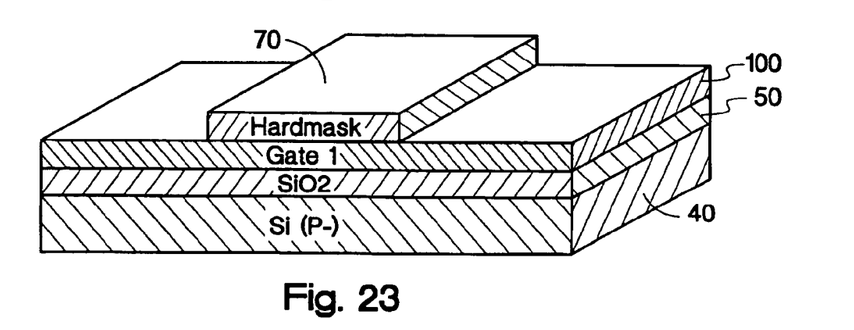
Figure 24:
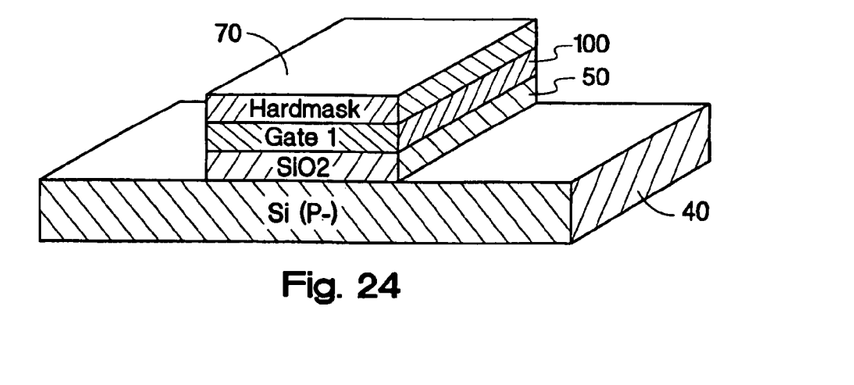
Figure 25:
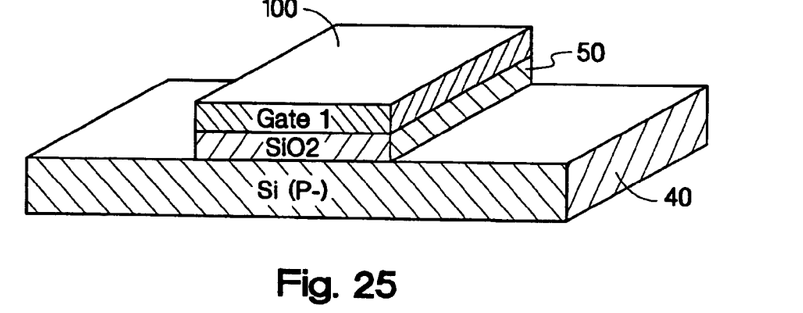

In step S50, a first hard mask material 70 is deposited (FIG. 22). In step S60, the hardmask layer is patterned by selective lift-off. FIG. 23 shows hardmask material 70 remaining in place where opening 65 had been formed, after lifting off the first hard mask material that is over resist layer 60. FIG. 24 shows the result of optional directional etching masked by first hardmask material 70, whereby a self-aligned floating gate 100 is defined if step S25 was performed. In step S75, the first hardmask material is optionally removed (FIG. 25).

Figure 26:
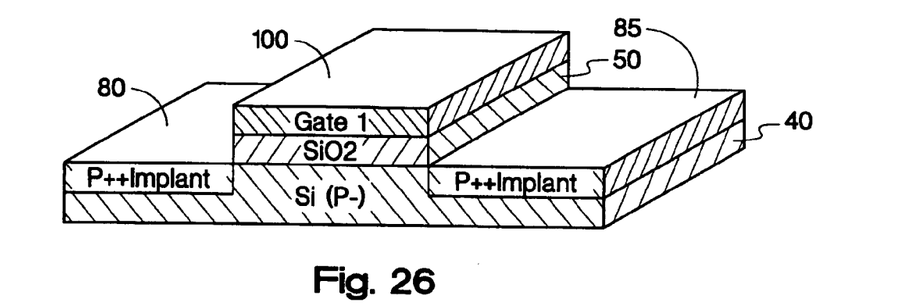
Figure 27:
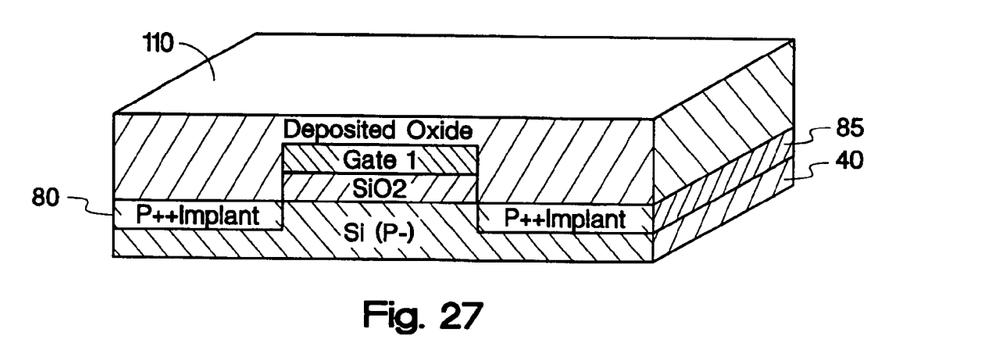

In step S65, a first dopant is ion-implanted in a conventional manner (P++ doping in this embodiment) to form isolation regions 80 and 85 spaced apart from each other in the substrate (FIG. 26). In step S80, a second oxide layer 110 is deposited with sufficient thickness to cover floating gate (Gate 1) if it is present (FIG. 27).

Figure 28:
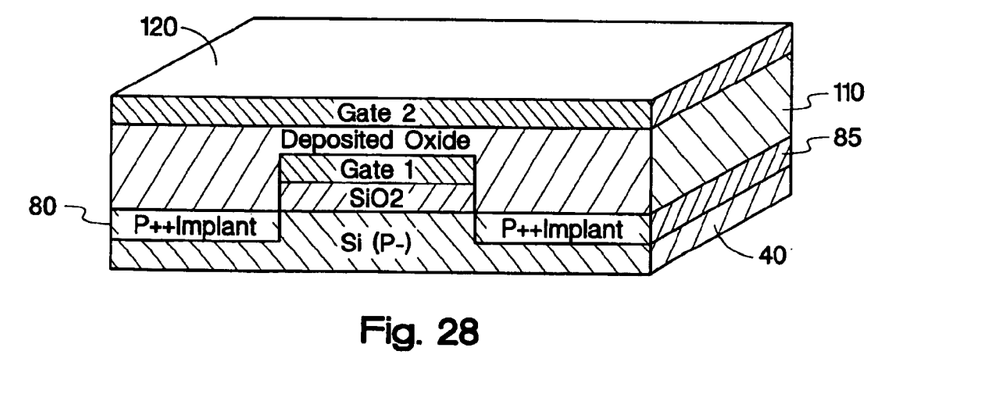
Figure 29:
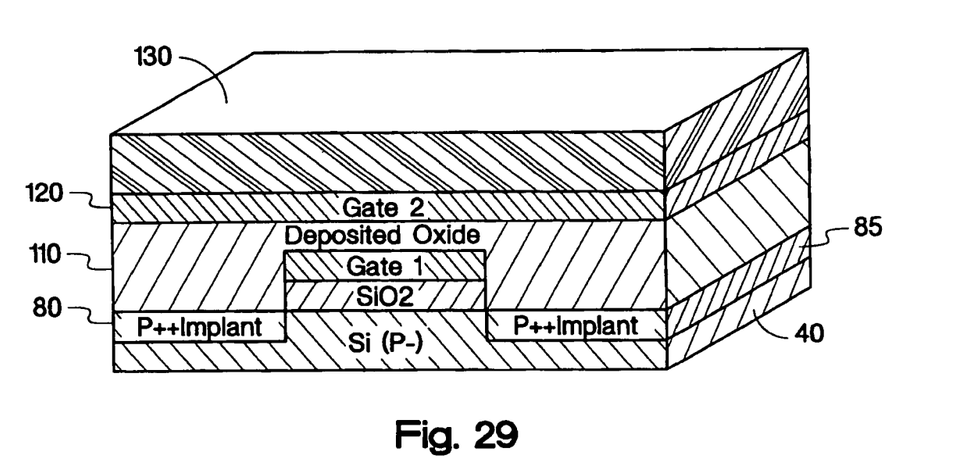
Figure 30:
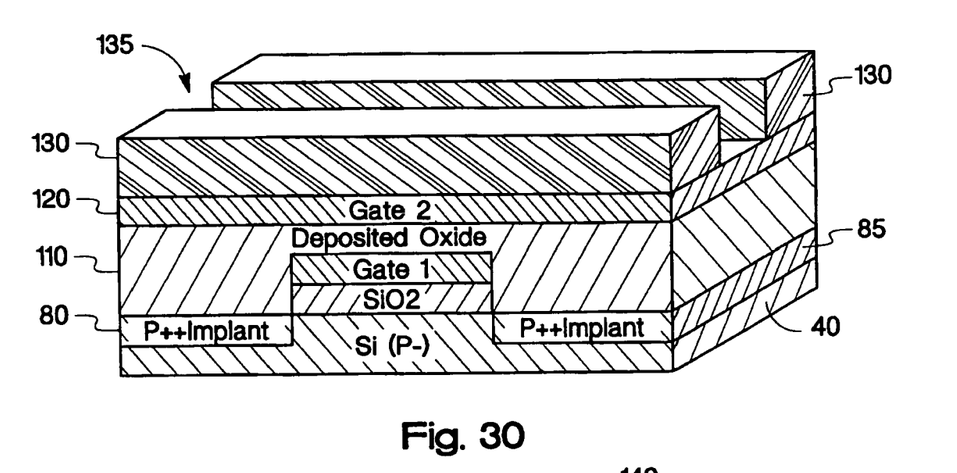

In step S85, a second conductive electrode layer 120 is deposited for Gate 2 (FIG. 28). A second layer of resist 130 is applied (step S90, FIG. 29). The second resist layer 130 is patterned by imprinting (S100). Thus, a second opening 135 is formed in second resist layer 130 (FIG. 30), forming a pattern aligned along a second direction. As mentioned above, nanoimprinting typically includes a step of directional etching such as reactive-ion etching (RIE) to completely remove resist material from the valleys (such as opening 135) formed by pressing with the mold.

Figure 31:
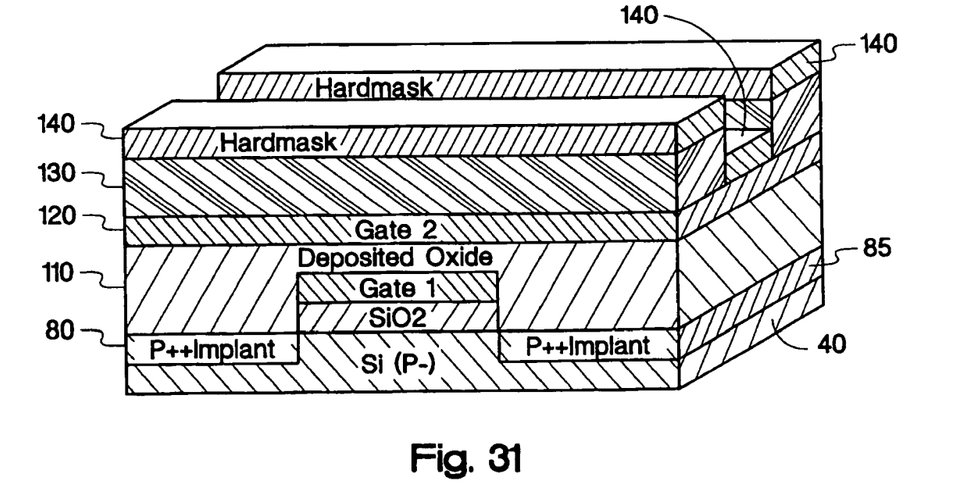
Figure 32:
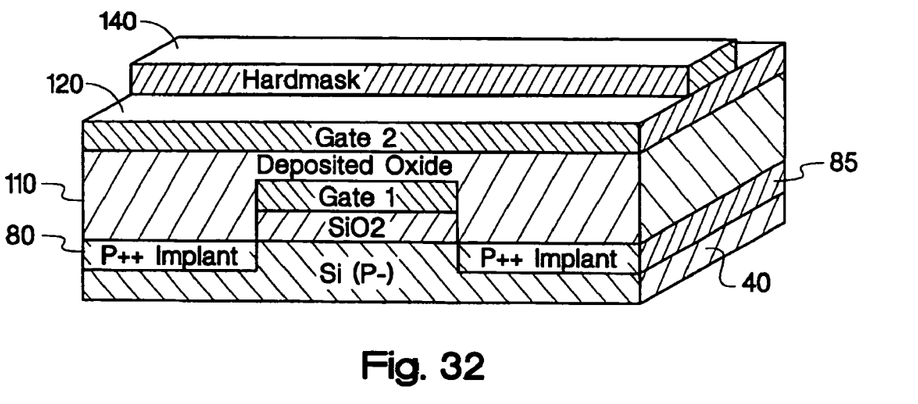
Figure 33:
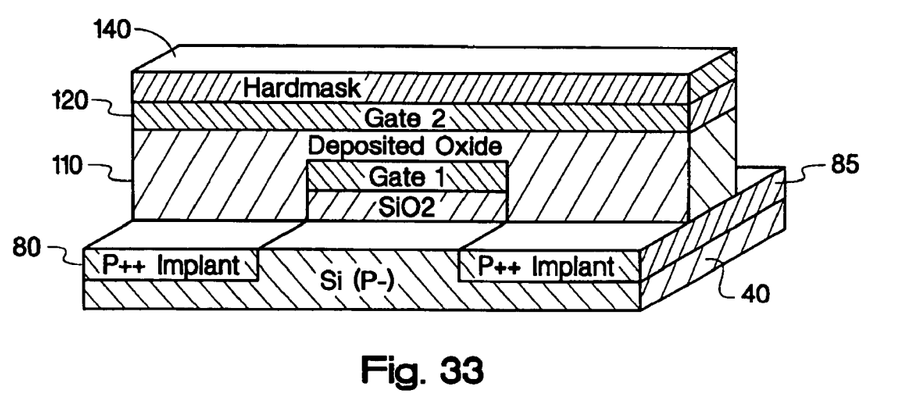

A second hardmask material 140 is deposited (step S110, FIG. 31). The Gate 2 electrode 120 is patterned by selective liftoff (step S120). FIG. 32 shows hardmask material 140 remaining in place where opening 135 had been formed, after lifting off the second hard mask material 140 that was over second resist 130.

Figure 34:
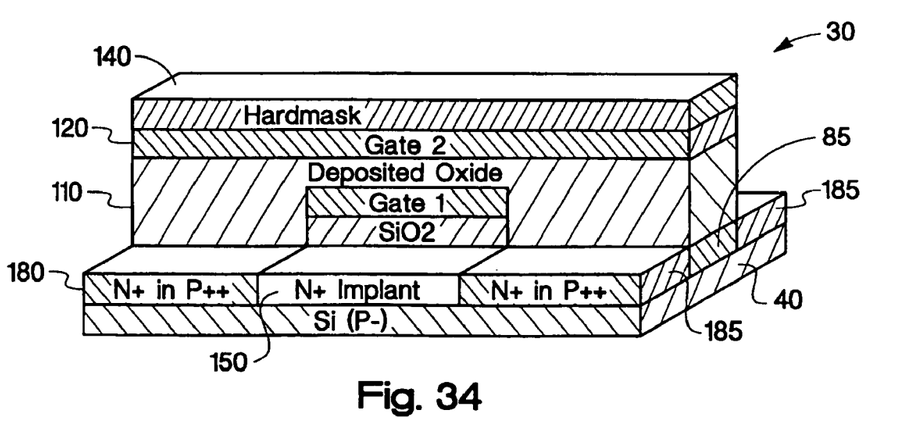

The remaining second hard mask material 140 serves as a mask for directional etching such as reactive-ion etching (RIE) down to the top surface of substrate (FIG. 33), exposing the substrate for step S130 of ion-implanting a second dopant to form the source and drain regions 180 and 185 (FIG. 34). After this second implant, the source and drain regions 180 and 185 have conductivity type N+ in P++ tub wells. This completes EPROM device 30. Optionally, the hard mask material 140 shown in FIG. 34 may be removed after the implant Those skilled in the art will recognize that, in a variation of the method, a material suitable for both hardmask 140 and gate 120 may be deposited at step S110 after step S100, allowing omission of step S85 shown in FIG. 16. That is, step S110 combines depositing gate electrode material 120 and hardmask 140 in one step. Generally, if either the first ion-implantation hard mask 70 or the second ion-implantation hard mask 140 is left in place after the step of forming source and drain regions, then that ion mask is suitably disposed to serve as a gate electrode 100 or 120.

In both methods illustrated by FIGS. 1 and 16, the second alignment direction may be made substantially orthogonal to the first alignment direction. Although the method may be used for larger devices, the smallest dimension of the first pattern and first doped regions may be less than about one micrometer, and the smallest dimension of the second pattern and second doped regions may be less than about one micrometer. In either method, a second gate insulated from the gate electrode and from the semiconductor substrate may be formed, disposed between the gate electrode and the semiconductor substrate.

While the embodiments have been described for clarity in terms of specific semiconductor conductivity types, those skilled in the art will readily recognize that other choices may be used, such as an N− substrate, N++ isolation implants, and P+ source and drain implants.

Those skilled in the art will also recognize that an array of nanoscopic transistors may be fabricated, in which the first and second patterns define a multiplicity of transistors disposed in an array. The array may be used in an integrated circuit and may be used in an electronic device. The first and second patterns further define a plurality of conductive interconnections, which may be selectively severed to selectively subdivide the array of nanoscopic transistors into cells. The interconnections may be adapted by conventional methods to be field-programmable.

Structures

Another aspect of the invention relates to arrays of series and/or parallel nanoscopic field effect transistors fabricated by the methods disclosed above. As described above, these may include field-programmable architectures. Most nano-imprint lithography techniques are limited to one layer or two orthogonal layers. By using self-aligned nanoscale transistors, the present invention uses only two patterned layers to build useful three-terminal devices, avoiding the difficulties of nanoscale alignment. By positioning a second gate which is left floating between the first gate and the channel, a structure is created that can trap charge and thus can be used as an EPROM, programming the presence or absence of any given transistor.

Thus, another aspect of the invention provides an array of nanoscopic transistors including a semiconductor substrate of a predetermined conductivity type, a multiplicity of first nanoscopic transistors comprising first doped regions of a second predetermined conductivity type, the first doped regions being disposed in the semiconductor substrate's surface and being arranged in parallel rows at least partially aligned along a first direction, the first doped regions being spaced apart pairwise by a first nanoscopic distance, the first nanoscopic distance defining lengths of first channels. The array of nanoscopic transistors also includes a multiplicity of first gate electrodes, each first gate electrode being aligned over one of the first channels. The array also includes a multiplicity of second nanoscopic transistors comprising second doped regions of a third predetermined conductivity type, the second doped regions being disposed in the substrate's surface and being arranged in parallel columns at least partially aligned along a second direction (otherwise having the same construction as the first nanoscopic transistors). Conductive interconnections are aligned parallel to the first and second directions, and these conductive interconnections selectively interconnect the first and second nanoscopic transistors. The first and second directions may be substantially orthogonal. The conductive interconnections comprise conductive segments, and the conductive interconnections may be made programmable by selective severing of these conductive segments.

Yet another aspect of the invention is an integrated circuit comprising an array of nanoscopic transistors formed in a semiconductor substrate of predetermined conductivity-type, first conductors at least partially aligned along a first direction for interconnecting the nanoscopic transistors, second conductors at least partially aligned along a second direction for interconnecting the nanoscopic transistors, and additional conductive interconnections aligned parallel to the first and second directions, for selectively interconnecting the first and second nanoscopic transistors.

INDUSTRIAL APPLICABILITY

The invention provides an array of nanoscopic transistors useful for integrated circuits and other electronic devices, including those to be carried by a substrate. The inventive fabrication methods using nano-imprint lithography techniques are specially adapted to produce such arrays of nanoscopic transistors while avoiding difficulties of nanoscale alignment.

Although the foregoing has been a description and illustration of specific embodiments of the invention, various modifications and changes thereto can be made by persons skilled in the art without departing from the scope and spirit of the invention as defined by the following claims. For example, to suit specific applications, various functionally equivalent materials may be substituted for those described herein and the order of steps in the methods may be varied. Insulators other than silicon oxide may be used. Various conductors known to those skilled in the art of semiconductor device fabrication may be used for the gates and their interconnections. Functionally equivalent non-liftoff imprint processes may be used in place of the lift-off imprint process described.

What is claimed is:

1. A method, comprising:
   forming a first oxide on a semiconductor substrate having a first conductivity type and covering the first oxide with a first gate electrode material;
   forming a first resist over the first gate electrode material and imprinting a first pattern on the first resist to expose areas of the first gate electrode material aligned along a first direction;
   forming a first hard mask over the exposed areas of the first gate electrode material and removing the first resist;
   removing first gate electrode material not covered by the first hard mask to form first gate electrodes aligned along the first direction;
   removing the first hard mask;
   implanting a first dopant having the first conductivity type into first regions in the semiconductor substrate adjacent to the first gate electrodes;
   forming a second oxide over the first gate electrodes and covering the second oxide with a second gate electrode material;
   forming a second resist over the second gate electrode material and imprinting a second pattern on the second resist to expose areas of the second gate electrode material aligned along a second direction substantially perpendicular to the first direction;

forming a second hard mask over the exposed areas of the second gate electrode material and removing the second resist;

removing second gate electrode material not covered by the second hard mask to form second gate electrodes aligned along the second direction; and implanting a second dopant having a second conductivity type opposite the first conductivity type into second regions of the semiconductor substrate adjacent to the second gate electrodes, each of the second regions overlapping parts of the first regions of the semiconductor substrate.

2. The method of claim 1, further comprising removing further portions of first gate electrode material that were not covered by the second hard mask to form floating gates.

3. The method of claim 2, wherein implanting the second dopant into the second regions of the semiconductor substrate creates source/drain regions of the second conductivity type where the further portions of the gate material were removed and leaves the overlapping parts of the first regions with the first conductivity type.

4. A method comprising:

forming a first oxide on a semiconductor substrate doped to a first conductivity type;

covering the first oxide with a first gate electrode material;

forming a first resist over the first gate electrode material;

imprinting a first pattern on the first resist to expose areas of the first gate electrode material aligned along a first direction;

selectively removing first gate electrode material to leave a first gate electrode defined by the first pattern;

doping regions in the semiconductor substrate adjacent to the first gate electrode, wherein doping regions in the semiconductor substrate adjacent to the first gate electrode comprises implanting a first dopant having the first conductivity type into first regions in the semiconductor substrate;

forming a second oxide over the first gate electrode, wherein the act of implanting the first dopant is performed after selectively removing first gate electrode material and before the act of forming the second oxide over the first gate electrode;

covering the second oxide with a second gate electrode material;

forming a second resist over the second gate electrode material;

imprinting a second pattern on the second resist to expose areas of the second gate electrode material aligned along a second direction different from the first direction;

selectively removing second gate electrode material to leave a second gate electrode defined by the second pattern after selectively removing second gate electrode material, implanting a second dopant having a second conductivity type opposite the first conductivity type into second regions of the semiconductor substrate adjacent to the second gate electrode, each of the second regions overlapping parts of the first regions of the semiconductor substrate; and selectively removing further portions of the first gate electrode material that were exposed by selectively removing the second gate electrode material, wherein implanting the second dopant into the second regions of the semiconductor substrate creates regions of the second conductivity type where the further portions of the gate material were removed and leaves the overlapping parts of the first regions with the first conductivity type.

* * * * *